(12) United States Patent
Andersen et al.

(10) Patent No.: US 8,594,173 B2
(45) Date of Patent: Nov. 26, 2013

(54) METHOD FOR DETERMINING UPDATED FILTER COEFFICIENTS OF AN ADAPTIVE FILTER ADAPTED BY AN LMS ALGORITHM WITH PRE-WHITENING

(75) Inventors: Robert L Andersen, San Francisco, CA (US); Grant Davidson, Burlingame, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 160 days.

(21) Appl. No.: 13/060,030

(22) PCT Filed: Aug. 24, 2009

(86) PCT No.: PCT/US2009/054726
§ 371 (c)(1),
(2), (4) Date: Feb. 21, 2011

(87) PCT Pub. No.: WO2010/027722
PCT Pub. Date: Mar. 11, 2010

(65) Prior Publication Data
US 2011/0158363 A1 Jun. 30, 2011

Related U.S. Application Data

(60) Provisional application No. 61/091,527, filed on Aug. 25, 2008.

(51) Int. Cl.
*H03H 7/30* (2006.01)
(52) U.S. Cl.
USPC .......................................... 375/232; 375/350
(58) Field of Classification Search
USPC ............... 375/232, 230, 350; 370/290; 455/1, 455/63.1, 67.11
See application file for complete search history.

(56) References Cited

U.S. PATENT DOCUMENTS 4,939,685 A * 7/1990 Feintuch ....................... 708/322
5,388,160 A * 2/1995 Hashimoto et al. ........ 381/71.14

(Continued)

FOREIGN PATENT DOCUMENTS

CN 1114122 12/1995
EP 1022866 7/2000

(Continued)

OTHER PUBLICATIONS

Masahiro Fukumoto et al (Improvement in Stability and Convergence Speed on Normalized LMS Algorithm, Circuits and Systems, 1995. ISCAS '95, 1995 IEEE International Symposium on (vol. 2, pp. 1243-1246), Apr. 30-May 3, 1995).*

(Continued)

*Primary Examiner* — Shuwang Liu
*Assistant Examiner* — Helene Tayong
(74) *Attorney, Agent, or Firm* — Weaver Austin Villeneuve & Sampson, LLP (57) ABSTRACT

The application relates to a method for determining at least one updated filter coefficient of an adaptive filter (22) adapted by an LMS algorithm. According to the method, filter coefficients of a first whitening filter (25') are determined, in particular filter coefficients of an LPC whitening filter. The first whitening filter (25') generates a filtered signal. A normalization value is determined based on one or more computed values obtained in the course of determining the filter coefficients of the first whitening filter (25'). The normalization value is associated with the energy of the filtered signal. At least one updated filter coefficient of the adaptive filter (22) is determined in dependency on the filtered signal and the normalization value. Preferably, updated filter coefficients for all filter coefficients of the adaptive filter (22) are determined.

30 Claims, 7 Drawing Sheets

(56) References Cited

U.S. PATENT DOCUMENTS

| | | | |
|---|---|---|---|
| 5,590,121 | A | 12/1996 | Geigel |
| 5,818,945 | A * | 10/1998 | Makino et al. ............... 381/66 |
| 6,151,614 | A | 11/2000 | Ikeda |
| 6,163,608 | A | 12/2000 | Romesburg |
| 6,246,760 | B1 | 6/2001 | Makino |
| 6,678,254 | B1 * | 1/2004 | Song ........................ 370/290 |
| 6,959,167 | B1 * | 10/2005 | Dehandschutter ............ 455/1 |
| 7,212,593 | B2 * | 5/2007 | He ............................ 375/346 |
| 2002/0087304 | A1 * | 7/2002 | Kjorling et al. ............ 704/219 |
| 2003/0005009 | A1 | 1/2003 | Usman |
| 2004/0252826 | A1 | 12/2004 | Tian |

FOREIGN PATENT DOCUMENTS

| | | |
|---|---|---|
| EP | 1569357 | 8/2005 |
| JP | S59-224913 | 12/1984 |
| JP | H07-312535 | 11/1995 |
| JP | H08-250981 | 9/1996 |
| JP | H11-068518 | 3/1999 |
| WO | 0004698 | 1/2000 |
| WO | 0016497 | 3/2000 |

OTHER PUBLICATIONS

Kensaku Fujii et al ("A Method for Continuing Adjustment of Adaptive Filter Coefficients in Voiceless Noise Terms Available for Acoustic Echo Canceller Systems", Electronics and Communications in Japan, Part 3, vol. 79, No. 10, 1996. Translated from Denshi Joho Tsushin Gakkai Ronbunshi, vol. 78-A, No. 11, Nov. 1995, pp. 1403-1409) in the same e.*

Gordy, J.D. et al., "A Combined LPC-Based Speech Coder and Filtered-X LMS Algorithm for Acoustic Echo Cancellation" ICASSP 2004, IEEE International Conference, vol. 4, IV125-IV128.

Widrow, et al., "Adaptive Signal Processing", Prentice-Hall, Englewood Cliffs, NJ 1985, pertinent page derived from Wikipedia.

Rabiner, et al., "Digital Processing of Speech Signals", Prentice-Hall, Englewood Cliffs, NJ, 1978, pp. 396-413 from Linear Predictive Coding of Speech relevant page.

Hansler, Eberhard, "Adaptive Echo Compensation Applied to the Hands-Free Telephone Problem" in Proc. ISCAS, 1990, p. 279-282.

Mboup, et al., "LMS Coupled Adaptive Prediction and System Identification: A Statistical Model and Transient Mean Analysis", IEEE Transactions on Signal Processing, vol. 42, No. 10, Oct. 1994, pp. 2607-2615.

Gazor, et al., "Adaptive Filtering with Decorrelation for Coloured AR Environments" IEEE Proc. Vis. Image Signal Process, vol. 152, No. 6, Dec. 2005, pp. 806-818.

Douglas, et al., "Self-Whitening Algorithms for Adaptive Equalization and Deconvolution" IEEE Transactions on Signal Processing, IEEE Service Center, New York, NY, US. vol. 47, No. 4, Apr. 1999, pp. 1161-1165.

Kondoz, A.M., "Digital Speech—Coding for Low Bit Rate Communication Systems" Second Edition, John Wiley & Sons, 2004, pp. 68-70.

* cited by examiner

METHOD FOR DETERMINING UPDATED FILTER COEFFICIENTS OF AN ADAPTIVE FILTER ADAPTED BY AN LMS ALGORITHM WITH PRE-WHITENING

CROSS-REFERENCE TO RELATED APPLICATIONS

This application claims priority to U.S. Patent Provisional Application No. 61/091,527, filed 25 Aug. 2008, hereby incorporated by reference in its entirety.

FIELD OF THE INVENTION

The patent application relates to system identification, in particular to a method for determining updated filter coefficients of an adaptive filter adapted by an LMS algorithm.

SUMMARY OF THE INVENTION

System identification is based on algorithms that build mathematical models of the dynamic behavior of a system or process from measured data. A common approach to system identification is to measure the output behavior of an unknown system in response to system inputs for determining a mathematical relation between the output behavior and the system inputs. This can often be done without going into the details of what is actually happening inside the system.

Figure 1:
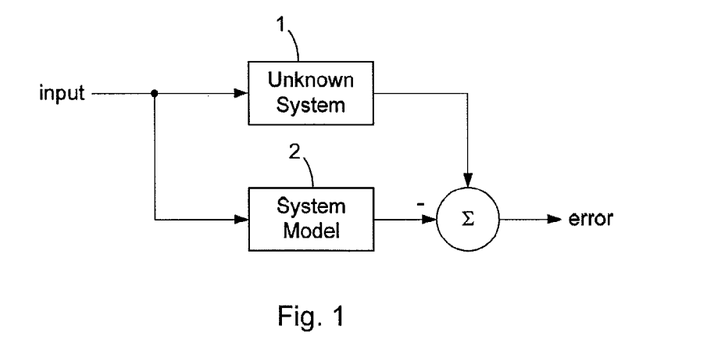
FIG. 1 illustrates modeling of an unknown system by a system model.

An unknown linear system can be completely characterized by its impulse response. However, since most real-world systems have infinite impulse responses (i.e. an impulse response with infinite length), it is common practice to model such systems using a finite-length approximation of the infinite impulse response. Because such finite approximation cannot exactly model a system having an infinite impulse response, the output behavior of the real-world system and of the model with finite approximation typically differ when the real-world system and the model are stimulated by the same input signal. FIG. 1 illustrates such modeling of an unknown system 1 by a system model 2. Both unknown system 1 and system model 2 are stimulated by the same input signal. For determining an error between the actual and modeled outputs, the output response of system model 2 is subtracted from the output response of unknown system 1. When the accuracy of approximation increases, the error between the actual and the modeled outputs decreases. In general, this method of approximation works well because the energy in the infinite impulse response of a real world system decreases with time, and eventually becomes negligible.

Many methods exist for approximating the impulse response of an unknown system. One class of method is direct measurement of the impulse response. While this method can be very effective, it becomes less attractive if the response of the unknown system changes over time. This is due to the fact that new measurements are required when the characteristics of the unknown system change. If the characteristics of the unknown system change frequently enough, it becomes impractical to perform new measurements for every change.

An alternative to direct measurement is automated measurement. Automated measurement algorithms are well-suited for characterizing systems that change over time because they can detect when the characteristics of the unknown system change, and determine new characteristics in response to the change.

A popular automated algorithm for approximating the impulse response of an unknown system is the LMS (least mean squares) algorithm used in adaptive filters. The LMS algorithm was originally proposed by Bernard Widrow and Ted Hoff in 1960 and is e.g. described in the textbook "Adaptive Signal Processing", B. Widrow, S. D. Stearns, Prentice-Hall, Englewood Cliffs, N.J., 1985 and on the Wikipedia webpage "http://en.wikipedia.org/wiki/Least_mean_squares_filter". These descriptions of the LMS algorithm are hereby incorporated by reference.

DESCRIPTION OF THE INVENTION

Figure 2:
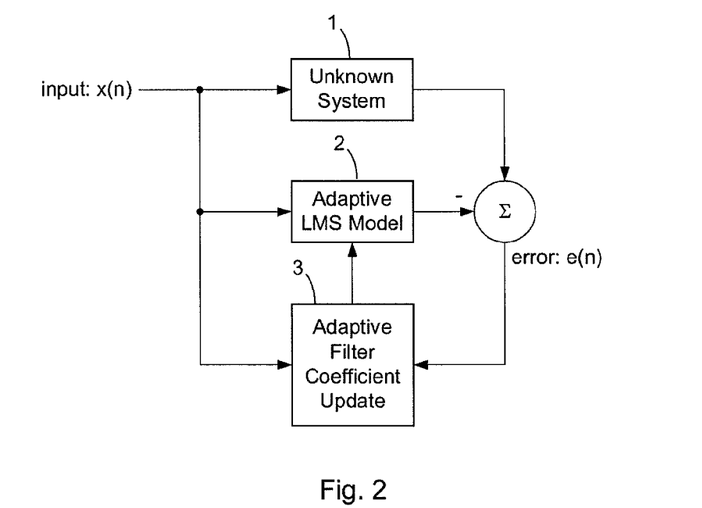
FIG. 2 illustrates an adaptive LMS filter system model.

FIG. 2 illustrates an adaptive LMS filter system model. Figurative elements in FIG. 1 and FIG. 2 denoted by the same reference signs are basically the same. In FIG. 2, an unknown system 1 and an adaptive filter 2 modeling unknown system 1 are stimulated by an input signal x(n). For determining an error e(n) between the actual and modeled outputs, the output signal of filter 2 is subtracted from the output signal of unknown system 1. The updated filter coefficients for adaptive filter 2 are generated by an update stage 3 in response to the error signal e(n), the input signal x(n) and previous filter coefficients as will be discussed in more detail below.

The LMS algorithm identifies the coefficients of finite impulse response (FIR) filter 2 that minimize the mean-square error between unknown system 1 and the approximation generated by filter 2.

The adaptive LMS filter uses a stochastic gradient descent algorithm to determine the approximation of unknown system 1. In case of the standard LMS algorithm, during each sampling interval of the input signal x(n), the adaptive FIR filter coefficients are updated using the following recursive equation that drives the filter coefficients in a direction to minimize the mean-square error $E\{|e(n)|^2\}$:

$$\hat{h}_i(n+1)=\hat{h}_i(n)+\mu \cdot x(n-i) \cdot e(n), \text{ for } i=0,1,\ldots,N-1. \quad \text{(Eq. 1)}$$

In equation 1, the term $\hat{h}_i(n+1)$ (with i=0, 1, . . . , N−1) denotes the updated filter coefficients of filter 2 having N filter coefficients in total. The term $\hat{h}_i(n)$ denotes the actual (i.e. before updating) filter coefficients. The term μ corresponds to a step size. In case of using a complex-valued input signal x(n) and having a complex-valued error signal, the term e(n) in Eq. 1 has to be amended to the conjugate complex term e*(n) as shown on the cited webpage "http://en.wikipedia.org/wiki/Least_mean_squares_filter".

Because the adaptive LMS filter uses a recursive algorithm, it does not instantaneously adapt to changes in the unknown system, but rather iteratively converges to an approximation of the new unknown system over a finite time interval. The amount of time required for the adaptive LMS filter to reach a minimum mean-square approximation for the unknown system is commonly referred to as convergence time. In order for the adaptive filter to rapidly respond to changes in unknown system 1, it is desirable for the convergence time to be as short as possible.

Figure 3:
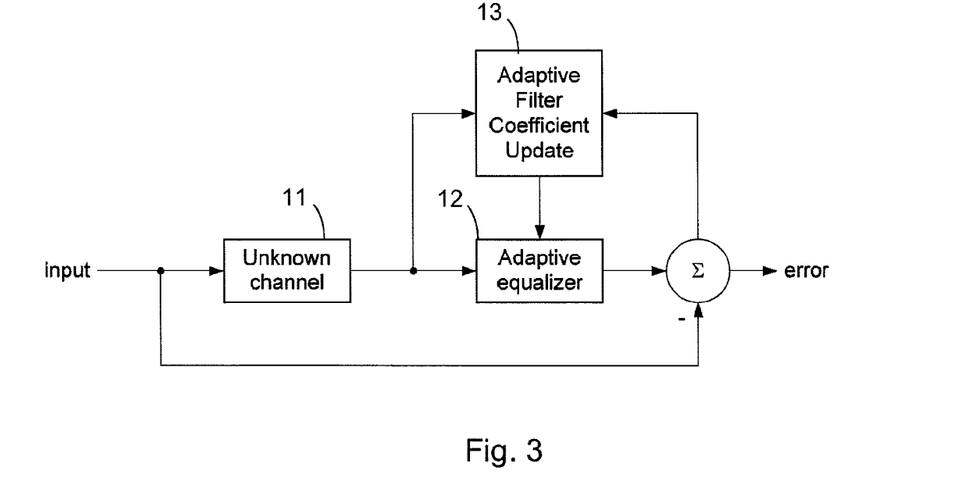
FIG. 3 illustrates the use of an adaptive LMS filter for adaptive channel equalization.

Some common applications which may employ adaptive LMS filtering are echo cancellation for mobile phones and public switched telephone networks, feed-forward and feedback active noise cancellation, and channel equalization. FIG. 3 illustrates the use of an adaptive LMS filter in an adaptive channel equalization application. Here, the filter coefficients of an adaptive equalizer 12 are adaptively updated by an LMS filter coefficient update stage 13 such that the adaptive equalizer 12 forms the inverse of an unknown channel 11.

A major problem of the adaptive LMS filter algorithm is that both its ability to converge to the optimal approximation of the unknown system and its convergence time depend on the characteristics of the input signal x(n) to the unknown system. In order to converge to the optimal solution, the input signal x(n) to the unknown system should ideally have a flat spectrum, i.e. the input signal should correspond to white noise. Additionally, in order to minimize the convergence time, the power of the input signal should be as high as possible.

As the power of the input signal decreases, the convergence time of LMS adaptive filters increases.

For some system identification applications, it is possible to have complete control over the input signal x(n). For these applications, an idealized input signal is chosen which allows that the adaptive LMS filter converges to the optimal approximation of the unknown system. Unfortunately, in most practical applications of system identification, complete control of the input signal is not possible. For these applications, it cannot be guaranteed that the adaptive LMS filter converges to the optimal approximation of the unknown system. Additionally, for unknown systems that change with time, the adaptive LMS filter may not be able to respond rapidly enough to changes in the unknown system.

Many variations of the standard adaptive LMS filter algorithm have been proposed that attempt to reduce the dependency of the approximation on the input signal x(n). A common variation is the adaptive normalized LMS (NLMS) algorithm. The NLMS algorithm is also described at the already cited Wikipedia web page "http://en.wikipedia.org/wiki/Least_mean_squares_filter". This description of the NLMS algorithm is hereby incorporated by reference.

The NLMS algorithm is identical to the standard LMS algorithm with the exception that it adds a normalization of the input signal power to the adaptive coefficient update stage. For the NLMS algorithm, the adaptive filter coefficients are updated according to the following equation:

$$\hat{h}_i(n+1) = \hat{h}_i(n) + \frac{\mu \cdot x(n-i) \cdot e(n)}{\sum_{i=0}^{N-1} x^2(n-i)}, \quad \text{(Eq. 2)}$$

for $i = 0, 1, \ldots, N-1$.

In case of using a complex-valued signal x(n), Eq. 2 has to be amended as shown on the cited webpage "http://en.wikipedia.org/wiki/Least_mean_squares_filter" (please see the section dealing with the NLMS algorithm).

In Eq. 2, the input signal energy is determined over a period from $t=n-N+1$ to $t=n$, i.e. the energy of the last N−1 samples up to the actual sample x(n) is determined.

The NLMS algorithm provides the advantage that the addition of normalization to the adaptive coefficient update stage decreases the dependency of the convergence time on the input signal power.

Unfortunately, the NLMS algorithm has two main drawbacks:
1. Similar as the LMS algorithm, the first drawback is that it is not guaranteed that the NLMS algorithm converges to the optimal approximation of the unknown system unless the input signal is white noise. This drawback reduces the usefulness of the NLMS algorithm in applications where the input signal to the unknown system is not completely controlled.
2. The second drawback is that the addition of normalization adds significant computational complexity to the algorithm. When considering an adaptive filter of filter length N (i.e. having N filter coefficients), for determining the normalization term, the sum of the powers of the current input sample and of the previous N−1 input samples has to be computed, and then the sum has to be inverted. A brute force calculation of such normalization scaling factor would require N multiply-accumulates (MACs) operations (an MAC operation computes the product of two numbers and adds the product to an accumulator: a+b·c→a) and 1 inversion operation (division) per sample:

$$\underbrace{\sum_{i=0}^{N-1} x^2(n-i)}_{\substack{1^{st}\ MAC \\ 2^{nd}\ MAC \\ N^{nd}\ MAC}} = x^2(n) + x^2(n-1) + \ldots + x^2(n-N+1) \quad \text{(Eq. 3)}$$

In practice, however, the number of required operations for computing an updated scaling factor can be reduced to 2 MACs and 1 division per sample:

$$\sum_{i=0}^{N-1} x^2(n-i) = \underbrace{\left[\sum_{i=0}^{N-1} x^2((n-1)-i)\right] + x^2(n) - x^2(n-N)}_{\substack{1^{st}\ MAC \\ 2^{nd}\ MAC}} \quad \text{(Eq. 4)}$$

By the $1^{st}$ MAC operation, the previous sum is added to the energy of the actual sample x(n). By the $2^{nd}$ MAC operation, the energy of the last sample x(n−N) in the previous sum is subtracted from this result. It is interesting to note that the complexity of this optimized calculation of the normalizing scaling factor is independent of the adaptive filter length.

For improving the convergence behavior of the standard LMS and NLMS algorithms in such a way that the algorithms converge to the optimal approximation of the unknown system, one may use pre-whitening of the input signal. Such pre-whitening of the input signal may be implemented by an LPC (linear prediction coding) whitening filter. Before discussing the next variation of the LMS filter algorithm more in detail, a brief background on linear prediction is given below.

A linear predictor attempts to estimate the next sample of a sequence x(n) from a weighted sum of previous input and output samples according to the following equation:

$$\tilde{x}(n) = \sum_{k=1}^{M} \alpha_k \cdot x(n-k) + \sum_{l=1}^{N} \beta_l \cdot \tilde{x}(n-l) \quad \text{(Eq. 5)}$$

The weighting coefficients $\alpha_k$ and $\beta_l$ of the predictor are chosen such that they minimize a measure of the error, commonly the mean-square error, between the actual sample x(n) and the predicted sample $\tilde{x}(n)$. Determining the optimal weighting coefficients $\alpha_k$ and $\beta_l$ requires solving a non-linear optimization problem and is therefore typically very difficult. However, if all coefficients $\beta_l$ are set to 0, such that the prediction is performed only based on past input samples, the coefficients $\alpha_k$ that minimize the mean square error can be determined by solving a linear least-squares problem, for which straightforward methods exist as discussed in the following section. Therefore, FIR linear predictors according to Eq. 5 with all $\beta_l$ set to 0 are more common than IIR linear predictors according to Eq. 5 with $\beta_l$ set to arbitrary values.

Many methods are known for computing the weighting coefficients $\alpha_k$ for an FIR linear predictor and a discussion of some methods can be found in the textbook "Digital Processing of Speech Signals", L. R. Rabiner and R. W. Schafer, Prentice-Hall, Englewood Cliffs, N.J., 1978. It is possible to analyze the signal and compute a fixed set of weighting coefficients $\alpha_k$. However, in order for the predictor to adjust to changing input signal conditions, it is common to recalculate the weighting coefficients $\alpha_k$ periodically.

Figure 4:
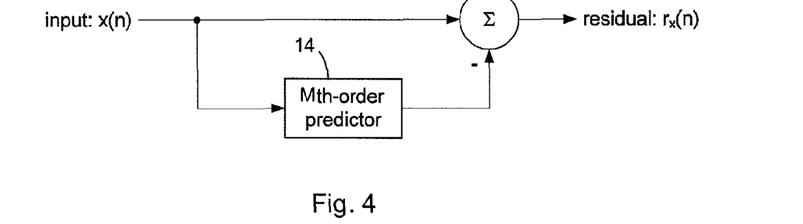
FIG. 4 illustrates an LPC whitening filter based on a linear predictor of $M^{th}$ order.

FIG. 4 illustrates an LPC whitening filter based on an FIR linear predictor 14 of $M^{th}$ order. The LPC whitening filter computes the difference between the actual input sample x(n) and the predicted sample $\tilde{x}(n)$ as generated by linear predictor 14:

$$r_x(n) = x(n) - \tilde{x}(n) = x(n) - \sum_{k=1}^{M} \alpha_k \cdot x(n-k) \quad \text{(Eq. 6)}$$

The output signal $r_x(n)$ of the LPC whitening filter is typically referred to as the residual. For a well designed predictor, in which the prediction coefficients are well matched to the input signal, the sequence of residual samples $r_x(n)$ tends to have a much flatter (i.e. whiter) spectrum than the input signal x(n). Unfortunately, the power of the residual signal $r_x(n)$ tends to be much lower than the power of the input signal.

Figure 5:
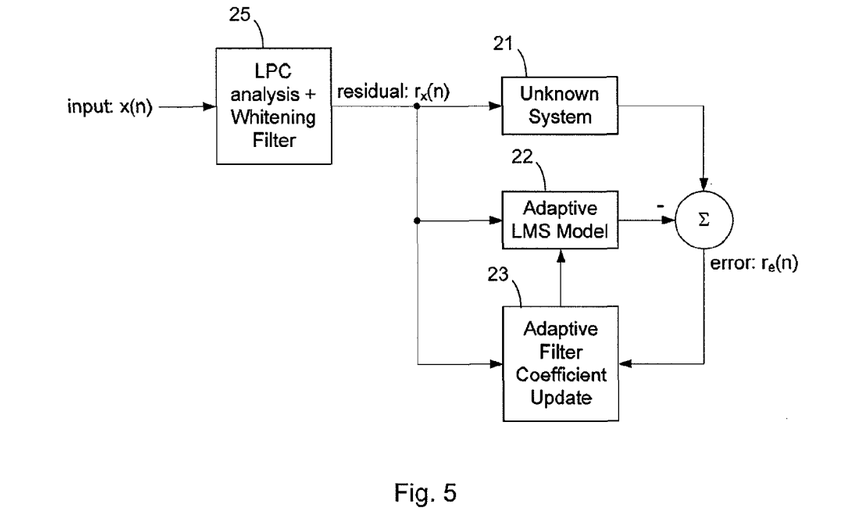
FIG. 5 illustrates an adaptive LMS filter with pre-whitening of the input signal by means of an LPC whitening filter.

As discussed above, the drawback of both the standard LMS and the NLMS algorithms is that it is not guaranteed for these algorithms that the algorithms converge to the optimal approximation of the unknown system for non-white input signals. For applications in which the input signal to the unknown system is not completely controlled, the convergence of both algorithms can be improved by pre-whitening the input signal x(n) using an LPC whitening filter. FIG. 5 illustrates an adaptive LMS filter with pre-whitening of the input signal x(n) by means of an LPC whitening filter 25. Besides for the actual LPC whitening filter operation as shown in FIG. 4, signal processing block 25 in FIG. 5 is also used for LPC analysis, i.e. for computing the filter coefficients of the LPC whitening filter. In FIG. 5, the residual $r_x(n)$ as generated by LPC whitening filter 25 feeds unknown system 21, adaptive filter 22 and filter coefficient update stage 23 used for determining updated filter coefficients of adaptive filter 22. Thus, the adaption of the adaptive LMS filter is based on the residual $r_x(n)$ instead of the signal x(n) in FIG. 3. The LMS algorithm in FIG. 5 may be the standard LMS algorithm or the NLMS algorithm. However, because LPC whitening filter 25 tends to lower the power of the signal which is input to the LMS algorithm, the combination of the LPC whitening filter and the standard LMS filter algorithm can suffer from slow convergence. Therefore, it is preferable to use the combination of the LPC whitening filter and the NLMS algorithm for optimal convergence performance. In this case, the filter coefficients are updated according to the following equation:

$$\hat{h}_i(n+1) = \hat{h}_i(n) + \frac{\mu \cdot r_x(n-i) \cdot r_e(n)}{\sum_{i=0}^{N-1} r_x^2(n-i)}, \quad \text{(Eq. 7)}$$

for $i = 0, 1, \ldots, N-1$.

In case of using a complex-valued signal x(n) and thus having a complex-valued residual signal $r_x(n)$, Eq. 7 has to be modified as discussed in connection with Eq. 2.

Figure 6:
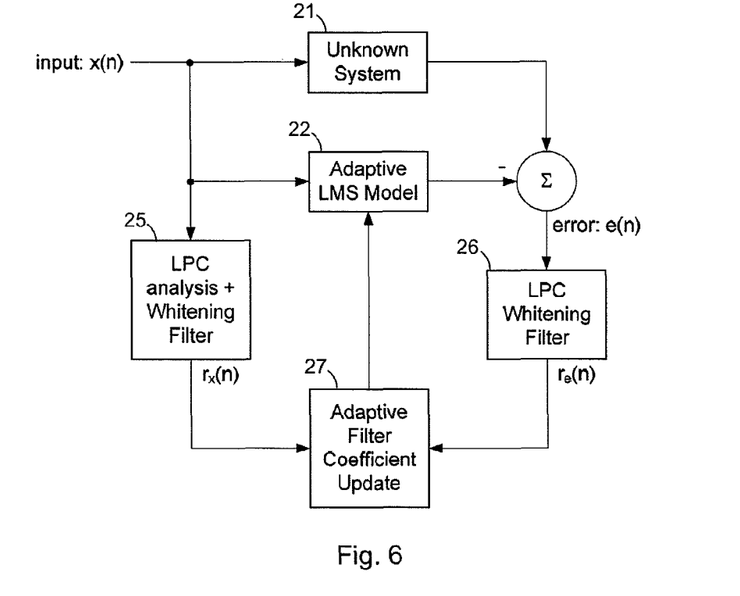
FIG. 6 illustrates an adaptive LMS filter with pre-whitening outside of the main signal path.

Although pre-whitening of the input signal can improve the convergence performance of the adaptive LMS filter, it has the drawback that it alters the input signal to the unknown system. In some applications, altering the input to the unknown system is undesirable. In particular for these applications, one may move the LPC whitening filter outside of the main signal path so that it does not alter the input to the unknown system and to the adaptive filter. Such approach is described in the document "LMS Coupled Adaptive Prediction and System Identification: A Statistical Model and Transient Mean Analysis", M Mboup et al., IEEE Transactions on Signal Processing, Vol. 42, No. 10, October 1994 and illustrated in FIG. 6. Here, LPC whitening filter 25 is moved into the update path of the LMS filter, i.e. in the path of the update stage 27 parallel to the adaptive filter 22. In FIG. 6 both adaptive filter 22 and unknown system 21 receive the non-whitened signal x(n) from upstream of LPC whitening filter 25, whereas in FIG. 5 both adaptive filter 22 and unknown system 21 receive the filtered signal $r_x(n)$. In order to make such alternative system work, a further LPC whitening filter 26 has to be applied to the error signal e(n) so the residual error signal $r_e(n)$ after whitening is used as an error signal for the LMS update algorithm. LPC whitening filter 26 is typically identical to LPC whitening filter 25, i.e. the filter coefficients of both filters are identical. Therefore, determination of the filter coefficients of LPC whitening filters 25 and 26 is carried out only in signal processing block 25 (see "LPC analysis" in block 25 of FIG. 6, which is missing in block 26) and the determined filter coefficients of LPC whitening filter 25 are transmitted to LPC whitening filter 26 (transmission of LPC filter coefficients not shown in FIG. 6).

As already discussed in connection with FIG. 5, the LMS algorithm in FIG. 6 may be the standard LMS algorithm or the NLMS algorithm. However, it is preferable to use the combination of the LPC whitening filter and the NLMS algorithm for optimal convergence performance.

While the combination of pre-whitening and the NLMS algorithm as shown in FIGS. 5 and 6 is effective in improving the convergence performance of the adaptive filter system, a high computational complexity is associated with both computing of the whitening filter coefficients and of the normalizing scaling factor for the adaptive NLMS filter update.

Therefore, it is an object to provide a method for determining updated filter coefficients of an adaptive filter adapted by an LMS algorithm, with the method preferably allowing reducing the computation complexity for computing the normalization used in the LMS filter update. At least the inventive method should provide an alternative for determining updated filter coefficients, wherein a normalization used in the LMS filter update is computed in an alternative way. Further objects are providing a corresponding apparatus for determining updated filter coefficients, providing a filter system comprising such apparatus, providing software for carrying out the method and providing a corresponding filter method.

These objects are achieved by the method, the apparatus, the filter system, the software and the filter method according to the independent claims.

A first aspect of the application relates to a method for determining at least one updated filter coefficient of an adaptive filter adapted by an LMS algorithm. The method may be used to determine filter coefficients of an adaptive filter adapted by an LMS algorithm in general.

According to the method, filter coefficients of a first whitening filter are determined, in particular filter coefficients of an LPC whitening filter. The first whitening filter generates a filtered signal. A normalization value is determined based on one or more computed values obtained in the course of determining the filter coefficients of the first whitening filter. The normalization value is associated with the energy of the filtered signal, e.g. the normalization value may be an energy estimate or the inverse of an energy estimate. At least one updated filter coefficient of the adaptive filter is determined in dependency on the filtered signal and the normalization value. Preferably, updated filter coefficients for all filter coefficients of the adaptive filter are determined.

For normalizing, the normalization value may be used as a multiplication factor in a multiplication operation (e.g. in case of using the inverse of an energy estimate as the normalization value). Instead, the normalization value may be used as a divisor in a division operation (e.g. in case of using an energy estimate as the normalizing value without inversion).

As discussed above, in case the standard NLMS algorithm is used in combination with pre-whitening, a normalization scaling factor is computed by directly determining the (short-time) signal power of the residual signal.

In contrast, the method makes use of one or more values as already computed by an algorithm for determining the filter coefficients of the whitening filter. Such algorithms for determining filter coefficients of a whitening filter often provide energy estimates or at least values which allow simple computing of the energy estimate for the output signal of the whitening filter as a side effect. One example of such algorithm is the autocorrelation method in combination with Durbin's algorithm for determining filter coefficients of an LPC whitening filter. The method according to the first aspect of the application determines a normalization value based on such one or more already computed values.

Preferred embodiments of the method provide reduced complexity for computing a normalizing scaling factor for an adaptive LMS filter coefficient update as will be explained later on.

Typically, the first whitening filter is an LPC whitening filter outputting a residual signal as the filtered signal. An LPC whitening filter typically contains filter coefficients derived from an LPC analysis and outputs a prediction error signal, i.e. the residual signal. Preferably, the used LPC whitening filter is based on an FIR filter structure. In the further examples and embodiments an LPC whitening filter based on an FIR filter structure is preferred, however, other structures for LPC whitening filters may be used.

There are several possible embodiments of LPC whitening filters that do not employ conventional FIR filter structures, such as LPC whitening filters that use either IIR filter structures, as discussed previously, or lattice filter structures. For example, the lattice LPC analysis method leads directly to an LPC whitening filter based on a lattice filter structure. This is described in section 8.3.3. and FIG. 8.3 of the already cited textbook "Digital Processing of Speech Signals", L. R. Rabiner and R. W. Schafer, Prentice-Hall, Englewood Cliffs, N.J., 1978. This description is hereby incorporated by reference. Lattice filters can also be used in conjunction with the autocorrelation and covariance methods of LPC analysis. Lattice filters have the convenient property that one can increase the prediction order by adding additional lattice sections onto the lattice filter structure without modifying filter coefficients in the preceding stages. In comparison to conventional FIR filters, the lattice structure is a different way of representing an FIR filter. A conventional FIR filter and a filter based on the lattice structure can be designed to return the same output sample for a given input sample.

It should be noted that the method relates also to whitening filters other than an LPC whitening filter. The method may use a Wiener filter as a whitening filter. Wiener filters include LPC as a special case when the form of the Wiener filter is an FIR structure.

According to a preferred embodiment, a normalizing value is derived from an energy estimate of the filtered signal obtained during the determination of the filter coefficients of the whitening filter. Thus, during calculation of LPC whitening filter coefficients, an estimate of the energy of the residual signal may be made, which is then inverted and used as a normalizing factor in an adaptive LMS coefficient update. Such energy estimate may be very similar (or even identical) to the denominator in Eq. 7.

If the estimate of the energy of the residual signal is similar to the actual energy of the residual signal (see denominator in Eq. 7), and the cost of computing the estimate is lower than the cost of computing the actual energy of the residual signal, a complexity reduction is achieved without a significant reduction in performance.

Accordingly, for determining the normalization value, the method preferably determines an energy estimate of the filtered signal based on such one or more computed values obtained in the course of determining the filter coefficients of the first whitening filter. The energy estimate may directly correspond to such computed value or may be determined by one or more computing operations. Then, the energy estimate may be inverted. The inverted energy estimate may be then used as a multiplication factor in a multiplication operation. Instead, the energy estimate may be used as a divisor in a division operation.

Such energy estimate may differ from the actual energy in particular due to the fact that the energy estimate is updated at an update rate lower than the sampling rate of an input signal.

Preferably, the filter coefficient update equation is as follows:

$$\hat{h}_i(n+1) = \hat{h}_i(n) + \frac{\mu \cdot r_x(n-i) \cdot r_e(n)}{\tilde{E}_r} \quad \text{(Eq. 8)}$$

Here, $i \in [0, 1, \ldots, N-1]$ corresponds to the number of the updated filter coefficient and N indicates the total number of filter coefficients of the adaptive filter. In case all N filter coefficients of the adaptive filter are updated, Eq. 8 is computed for $i=0, 1, \ldots, N-1$. The term $\hat{h}_i(n+1)$ denotes the updated filter coefficient; the term $\hat{h}_i(n)$ denotes the corresponding actual filter coefficient, $r_x$ denotes the filtered signal, $r_e$ denotes an error signal and $\tilde{E}_r$ denotes the energy estimate.

Eq. 8 is identical to Eq. 7 of the standard NLMS filter coefficient update in combination with LPC pre-whitening, with the exception that the normalizing scaling factor has been changed from the power sum $$\sum_{i=0}^{N-1} r_x^2(n-i)$$

of the residual signal to an energy estimate $\tilde{E}_r$ of the of the residual signal.

As already discussed in connection with Eq. 2 and Eq. 7, the signal $x(n)$ and thus the residual signal $r_x(n)$ may be also a complex-valued signal instead of a real-valued signal. In this case the conjugate complex $r_e^*(n)$ of the error signal has to be used in Eq. 8 instead of $r_e(n)$.

For an LPC whitening filter, many methods for calculating the LPC whitening filter coefficients are known, e.g. the autocorrelation method, the covariance method and the lattice method. Some of these methods include computationally efficient methods for determining an estimate of the residual signal energy.

Preferably, for determining the filter coefficients of the LPC whitening filter the autocorrelation method is used. The autocorrelation method for determining the filter coefficients of an FIR linear predictor in an LPC whitening filter is e.g. described in section 8.1.1 of the already cited textbook "Digital Processing of Speech Signals", L. R. Rabiner and R. W. Schafer, Prentice-Hall, Englewood Cliffs, N.J., 1978. The description of the basic principles of linear predictive analysis in section 8.1, pages 398-401 of this textbook and the description of the autocorrelation method in section 8.1.1, pages 401-403 of this textbook are hereby incorporated by reference. The autocorrelation method leads to a matrix equation for determining the filter coefficients of the $M^{th}$ order FIR linear predictor in the LPC whitening filter.

Preferably, for solving such matrix equation, Durbin's algorithm is used. Durbin's algorithm for solving the matrix equation is e.g. described in section 8.3.2, pages 411-413 of the already cited textbook "Digital Processing of Speech Signals". This description of Durbin's recursive solution for the autocorrelation equations is hereby incorporated by reference. The autocorrelation method and Durbin's algorithm for the autocorrelation equations is also described on pages 68-70 of the textbook "Digital Speech—Coding for Low Bit Rate Communication Systems", A. M. Kondoz, Second Edition, John Wiley & Sons, 2004. This description is also hereby incorporated by reference.

Durbin's algorithm for solving the autocorrelation equations uses the following recursive equations to determine the filter coefficients of the $M^{th}$ order FIR linear predictor in the LPC whitening filter:

$$R_i = \sum_{m=0}^{L-1-i} x(m) \cdot x(m+i) \quad \text{(Eq. 9)}$$

$$E_0 = R_0 \quad \text{(Eq. 10)}$$

$$k_i = \frac{R_i - \sum_{j=1}^{i-1} \alpha_j^{(i-1)} \cdot R_{i-j}}{E_{i-1}}, \quad 1 \le i \le M \quad \text{(Eq. 11)}$$

$$\alpha_i^{(i)} = k_i \quad \text{(Eq. 12)}$$

$$\alpha_j^{(i)} = \alpha_j^{(i-1)} - k_i \cdot \alpha_{i-j}^{(i-1)}, \quad 1 \le j \le i-1 \quad \text{(Eq. 13)}$$

$$E_i = (1 - k_i^2) \cdot E_{i-1} \quad \text{(Eq. 14)}$$

In Eq. 9 for determining the autocorrelation R, the term x(m) denotes selected samples of the input signal in a window of length L, the samples starting with x(m) and extending through x(m+L−1). Outside of the window, the input signal is considered as zero. Preferably, each time a new set of LPC coefficients is calculated, the input signal sample window shifts according to the LPC coefficient update rate (i.e. the window shifts by K input samples which is the inverse of the update rate, see Eq. 17 below). In case of complex-valued input signals, the above equations 9, 13 and 14 need to be modified. In Eq. 9, the term x(m+i) is replaced by the complex conjugate x*(m+i). In Eq. 13, the term $\alpha_{i-j}^{(i-1)}$ is replaced by the complex conjugate. In Eq. 14, the term $k_i^2$ is replaced by the square of the modulus $|k_i|^2$, which is equivalent to $k_i \cdot k_i^*$.

Eq. 10 to Eq. 14 are solved for iterations i=1, 2, ..., M. The filter coefficients $\alpha_j$ of the $M^{th}$ order predictor are determined according to the following equation:

$$\alpha_j = \alpha_j^{(M)}, \quad 1 \le j \le M \quad \text{(Eq. 15)}$$

The term $E_i$ in iteration i corresponds to the squared prediction error for a linear predictor of order i. Preferably, the method according to the first aspect of the application determines the energy estimate $\tilde{E}_r$ as a squared prediction error $E_i$ of iteration i (i.e. the squared prediction error for a linear predictor of order i), with i∈[0, 1, ..., M]. More preferably, the determined energy estimate $\tilde{E}_r$ corresponds to the squared prediction error $E_M$ of the last iteration of Durbin's algorithm. The squared prediction error $E_M$ used as an energy estimate is in this case determined based on the squared prediction error $E_{M-1}$ of the penultimate iteration of Durbin's algorithm. In line with Eq. 14 and i=M, the squared prediction error $E_M$ may be determined according to the following equation:

$$E_M = (1 - k_M^2) \cdot E_{M-1} \quad \text{(Eq. 16)}$$

When using $E_M$ as an energy estimate, the normalization value or normalization scaling factor preferably corresponds to $1/E_M$.

Preferably, the energy estimate may be computed by 2 additional MAC operations. In case of using $E_M$ as an energy estimate, $E_M$ is typically computed in line with Eq. 16 by a first MAC operation, where $(1-k_M^2)$ is determined, and by a second MAC operation, where the result of the first MAC operation is multiplied by $E_{M-1}$. It should be noted that the first MAC operation includes both a multiplication and an accumulation, whereas the second MAC operation includes only a multiplication. However, the processing cost for each is typically the same and both are therefore referred to as MACs. Please further note that for determining the filter coefficients $\alpha_j$, $E_M$ does not have to be computed, i.e. $E_i$ in Eq. 14 is typically not computed in the last iteration where i=M. However, in case of using $E_M$ as an energy estimate for normalization, said 2 additional MAC operations for determining $E_M$ are performed. Thus, once the LPC whitening filter coefficients have been determined using the recursive algorithm above or a modified version thereof, a simple additional calculation (i.e. 2 MACs) yields an estimate of the residual energy, which may be then inverted (1 division) to determine a normalizing factor. Please note that these computing costs (2 MACs and 1 division) are equivalent to the previously stated costs for determining the normalizing scaling factor for the NLMS algorithm.

Instead of inverting the energy estimate for determining a normalizing factor, one may also use the energy estimate as a divisor for dividing one or more factors of the product in Eq. 8.

It should be noted that one may also use $E_{M-1}$ (or any other $E_i$) instead of $E_M$ as an estimate for the residual energy. In this case, the 2 additional MAC operations are typically not necessary, since $E_{M-1}$ was already computed for determining the filter coefficients $\alpha_j$ of the $M^{th}$ order predictor.

Instead of using the autocorrelation method for determining the filter coefficients of the whitening filter, one may use a different method for determining the filter coefficients and may determine an energy estimate based thereon. E.g., in case of using the covariance method in combination with the Cholesky decomposition solution for LPC analysis, one may determine an energy estimate of the filtered signal based on Eq. 8.65 on page 411 of the already cited textbook "Digital Processing of Speech Signals" (see mean-squared prediction error $E_n$ which can be used as an energy estimate). The description of the covariance method in section 8.1.2, pages 403-404 and the description of the Cholesky decomposition solution in section 8.3.1, pages 407-411 of the textbook "Digital Processing of Speech Signals" are hereby incorporated by reference.

According to a preferred embodiment of the method, the filter coefficients of the first whitening filter are adaptively updated. An updated normalization value may be determined each time the filter coefficients of the first whitening filter are updated. The filter coefficients of the first whitening filter (in particular first LPC filter) may be updated less frequently than once per sample. Thus, the filter coefficients of the first whitening filter and the normalization value may be updated at an update rate lower than the sampling rate of the input signal upstream of the adaptive filter and the first whitening filter. E.g. the normalization value may be updated at an update rate of 1/64 updates per time unit, whereas the sampling rate corresponds to 1 sample per time unit.

Because the normalizing value is preferably only updated when the whitening filter coefficients are updated, the cost to compute the normalizing value is no longer constant, but depends on how often the whitening filter coefficients are updated.

However, in case of updating the filter coefficients less frequently than once per sample (e.g. once per 128 samples), the accuracy of the squared prediction error $E_M$ (or any other squared prediction error $E_i$) for estimating the energy of the filtered signal may decrease, since the energy may change over the update period.

For a system in which the filter coefficients of the first whitening filter are updated once every K samples, the computational cost C per sample (!) of computing the preferred normalizing value or factor $1/E_M$ is defined by the following relationship:

$$C(K) = \frac{2}{K} MACs + \frac{1}{K} \text{ Divisions} \quad \text{(Eq. 17)}$$

It is clear from this general relationship in Eq. 17 that as K increases, the cost per sample to compute the normalizing factor decreases, reducing the complexity with respect to standard NLMS (where the cost per sample for computing the normalizing scaling factor is 2 MACs+1 Division).

Preferably, the update rate (i.e. 1/K in Eq. 17 above) for updating the filter coefficients of the first whitening filter and the normalization value is selected such that the statistical characteristics of the input signal are essentially stationary over the update period. In this case, the energy estimate and therefore the normalizing factor will be very similar to the normalizing factor in the NLMS algorithm. This allows a complexity reduction without significant impact to the performance. If however, the statistics of the input signal are highly non-stationary over the update period, a complexity reduction will still be achieved, but at the expense of convergence performance.

However, it is not necessary that the filter coefficients of the first whitening filter are updated over and over: The coefficients of the whitening filter and the normalizing value may be computed once and then remain fixed. Such case corresponds to an update period of K=∞. The cost (per sample) of computing the normalizing scaling factor is 0, and the overall cost of performing the algorithm equals the cost of the LPC whitening filter and the LMS algorithm.

Such fixed whitening filter coefficients and fixed normalizing value work very well in some applications, specifically in applications where the characteristics of the input signal are known a-priori and are time-invariant. In such applications, the fixed whitening filter coefficients and normalizing value are effectively time-invariant and so updating them periodically will not significantly improve performance.

In case of K=1, the normalizing value is computed once per sample. In this case, the cost C(K=1) of computing the normalizing value as given by Eq. 17 is equivalent to the cost for computing the normalization in the traditional NLMS algorithm. As this represents typically the maximum update rate, it shows that for any value of K, the cost of computing the normalizing value according to the preferred embodiment of the method is always less than or equal to the cost of computing the normalizing scaling factor for the NLMS algorithm.

A second aspect of the application relates to an apparatus for determining at least one updated filter coefficient of an adaptive filter adapted by an LMS algorithm. The means in the apparatus correspond to the method steps of the method according to the first aspect of the application. Thus, the apparatus comprises means for determining filter coefficients of a first whitening filter (e.g. of an LPC whitening filter) outputting a filtered signal, and for determining a normalization value based on one or more computed values obtained in the course of determining the filter coefficients of the first whitening filter. The apparatus further comprises an update stage for determining at least one updated filter coefficient of the adaptive filter in dependency on the filtered signal and the normalization value. Preferably, the means for determining filter coefficients of the first whitening filter and for determining a normalization value form a common signal processing unit. The common unit transmits the determined normalization value to the update stage.

The above remarks related to the first aspect of the application are also applicable to the second aspect of the application.

A third aspect of the application relates to a filter system comprising an adaptive filter adapted by an LMS algorithm and a first whitening filter (e.g. an LPC whitening filter). Further, the filter system contains means for determining filter coefficients of the first whitening filter outputting a filtered signal and for determining a normalization value based on one or more computed values obtained in the course of determining the filter coefficients of the first whitening filter. In addition, for performing the LMS algorithm, the filter system comprises an update stage for determining at least one updated filter coefficient of the adaptive filter in dependency on the filtered signal and the normalization value.

The complete filter system or parts thereof may be realized by a DSP (digital signal processor).

The above remarks related to the first and second aspects of the application are also applicable to the third aspect of the application.

A fourth aspect of the application relates to a software program comprising instructions for performing the method according to the first aspect of the application, when the program is executed, e.g. on a computer or on a DSP.

The above remarks related to the first, second and third aspects of the application are also applicable to the fourth aspect of the application.

A fifth aspect of the application relates to a method for filtering a signal by an adaptive filter, with the adaptive filter adapted by an LMS algorithm. At least one updated filter coefficient of the adaptive filter is determined according to the method as discussed above. The above remarks related to the other aspects of the application are also applicable to the fifth aspect of the application.

DESCRIPTION OF THE DRAWINGS

The invention is explained below in an exemplary manner with reference to the accompanying drawings, wherein.

FIGS. 1-6 were already discussed above.

Figure 7:
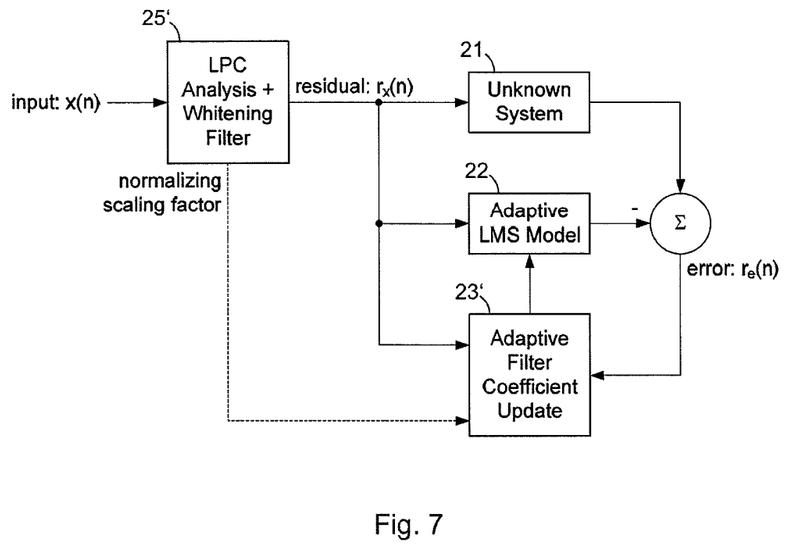
FIG. 7 illustrates a first embodiment, with a normalizing factor being transmitted from an LPC whitening filter to an adaptive coefficient update stage.

FIG. 7 illustrates a first embodiment of the invention. The first embodiment is similar to the configuration in FIG. 5. Figurative elements in FIG. 5 and FIG. 7 denoted by the same reference signs are basically the same. Moreover, the remarks to FIG. 5 are basically also applicable to FIG. 7.

In FIG. 7, an input signal x(n) is fed to a unit 25' comprising an LPC whitening filter and LPC analysis means (i.e. means for determining filter coefficients of the LPC whitening filter). The LPC whitening filter is preferably an LPC whitening filter based on an FIR structure. The residual signal $r_x(n)$ as generated by LPC whitening filter 25' feeds an unknown system 21, an adaptive filter 22 used to model the unknown system 21 and an LMS filter coefficient update stage 23' for determining updated filter coefficients of adaptive filter 22. An error signal $r_e(n)$ is generated by subtracting the output signal of adaptive filter 22 from the output signal of unknown system 21.

Moreover, unit 25' for determining the filter coefficients also determines an energy estimate $\tilde{E}_r$ of the residual signal $r_x(n)$ based on computed values obtained in the course of determining the filter coefficients of the LPC filter. The energy estimate is then inverted and transmitted as a normalizing scaling factor $1/\tilde{E}_r$ from unit 25' to the adaptive coefficient update stage 23'.

IMPLEMENTATION

Preferably, as already discussed above, the squared prediction error $E_M$ of the last iteration of Durbin's algorithm for solving the autocorrelation equations is determined and used as an energy estimate $\tilde{E}_r$. In case of using $E_M$ as an energy estimate $\tilde{E}_r$, $E_M$ is preferably computed by a first MAC operation, where $(1-k_M^2)$ is determined, and by a second MAC operation, where the result of the first MAC operation is multiplied by $E_{M-1}$ (see Eq. 16).

Thus, once the LPC whitening filter coefficients have been determined using Durbin's algorithm, a simple additional calculation (i.e. 2 MACs) yields an estimate $E_M$ of the residual energy, which is then inverted (1 division) to determine a normalizing factor $1/E_M$.

In case of using $E_M$ as an energy estimate $\tilde{E}_r$, the filter coefficients of the adaptive filter 22 are updated according to the following equation:

$$\hat{h}_i(n+1) = \hat{h}_i(n) + \frac{1}{E_M} \cdot \mu \cdot r_x(n-i) \cdot r_e(n), \qquad \text{(Eq. 18)}$$

for $i = 0, 1, \ldots, N-1$.

Here, the term $1/E_M$ corresponds to the normalizing scaling factor which is transmitted from unit 25' to update stage 23'. Alternatively, normalization may be performed by using $E_M$ as a divisor in a division operation (instead of a multiplication factor in a multiplication operation). Instead of transmitting $1/E_M$, in an alternative embodiment $E_M$ or in another alternative embodiment $E_{M-1}$ and $k_M$ are transmitted from unit 25' to update stage 23'. As already discussed in connection with Eq. 8, the signal x(n) and thus the residual signal $r_x(n)$ may be also a complex-valued signal instead of a real-valued signal. In this case the conjugate complex $r_e^*(n)$ instead of $r_e(n)$ has to be used in Eq. 18.

Preferably, the filter coefficients of LPC whitening filter 25' and the normalization value are updated every K samples of the input signal x(n), with K>1, e.g. K=8, 16, 32 or 64. This reduces the computing cost for determining the normalizing scaling factor in comparison to the computing costs for determining the normalizing scaling factor in the standard NLMS algorithm as already discussed above. Alternatively, K=1 could be used.

Although pre-whitening of the input signal x(n) improves the convergence performance of the adaptive LMS filter, it has the drawback that it alters the input signal to unknown system 21. In some applications, altering the input to the unknown system 21 is undesirable. In particular for these applications, one may move LPC whitening filter 25' outside of the main signal path, so that it does not alter the input to unknown system 21 and to adaptive filter 22. This approach was already discussed in connection with FIG. 6.

Figure 8:
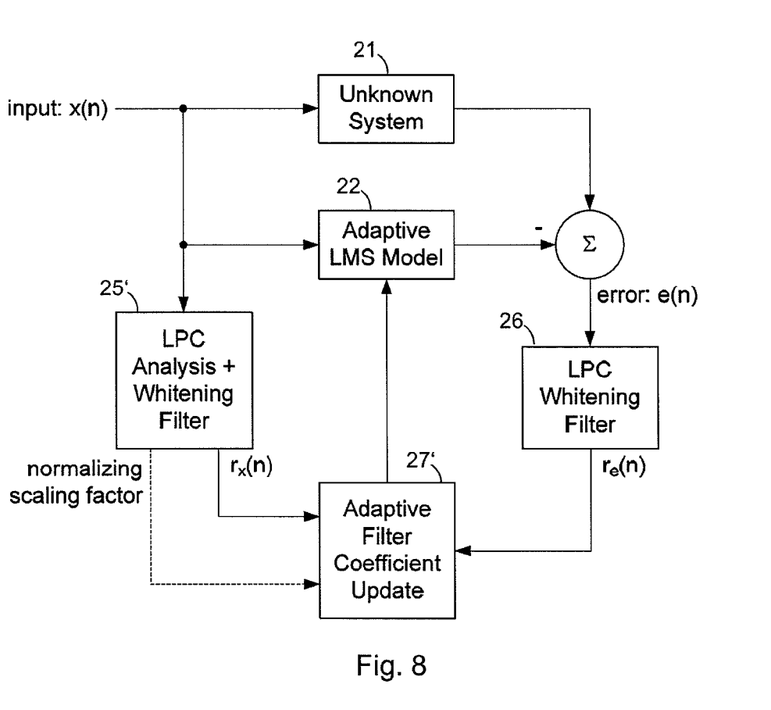
FIG. 8 illustrates a second embodiment, with a normalizing factor being transmitted from an LPC whitening filter to an adaptive coefficient update stage and pre-whitening being outside of the main signal path.

FIG. 8 illustrates a second embodiment, where in contrast to the first embodiment in FIG. 7 pre-whitening is performed outside of the main signal path as already discussed in connection with FIG. 6. Figurative elements in FIGS. 6-8 denoted by the same reference signs are basically the same. In contrast to the first embodiment in FIG. 7, in FIG. 8 LPC whitening filter 25' (preferably based on an FIR structure) is moved into the update path of the LMS filter, i.e. in the path of update stage 27' parallel to adaptive filter 22. In FIG. 8, both adaptive filter 22 and unknown system 21 receive the non-whitened signal x(n) from upstream of LPC whitening filter 25', whereas in FIG. 7 adaptive filter 22 and unknown system 21 receive the filtered signal $r_x(n)$. In order to make such alternative system work, a further LPC whitening filter 26 is applied to the error signal e(n) so such the residual error signal $r_e(n)$ after whitening is used as an error signal for the LMS update algorithm. The LPC whitening filter in block 26 is identical to the LPC whitening filter in block 25', i.e. the filter coefficients of both filters are identical. Therefore, determining of the filter coefficients of LPC whitening filters 25' and 26 is carried out only in signal processing block 25' (see "LPC analysis" in block 25' of FIG. 8, which is missing in block 26) and the determined filter coefficients of LPC whitening filter 25' are sent to LPC whitening filter 26 (sending not shown in FIG. 8).

In FIG. 8 the normalizing scaling factor is determined in the same way as in FIG. 7, preferably the normalizing scaling factor corresponds to $1/E_M$ as already discussed in connection with FIG. 7. In this case a simple additional calculation (i.e. 2 MACs) yields an estimate $E_M$ of the residual energy, which is then inverted (1 division) to determine a normalizing factor $1/E_M$. Preferably, the filter coefficients of the LPC whitening filter 25' and the normalization value are updated every K samples of the input signal $x(n)$, with $K>1$.

The filter update stage 27' receiving the normalizing scaling factor from unit 25' updates the filter coefficients of adaptive filter 22 in line with Eq. 18.

As already discussed above, for the systems in FIGS. 7 and 8 where the filter coefficients of the first whitening filter and the normalizing scaling factor are updated once every K samples, the computational cost C per sample for computing the preferred normalizing scaling factor $1/E_M$ is defined by Eq. 17 as repeated below:

$$C(K) = \frac{2}{K} MACs + \frac{1}{K} \text{ Divisions} \quad \text{(Eq. 17)}$$

As K increases starting from 1, the cost per sample to compute the normalizing factor decreases, reducing the complexity with respect to standard NLMS (where the cost per sample for computing the normalizing scaling factor is 2 MACs+1 Division). Preferably, the update rate for updating the filter coefficients of the LPC whitening filter 25' and for updating the normalizing scaling factor is chosen such that the statistical characteristics of the input signal are essentially stationary over the update period. In this case, the energy estimate and therefore the normalizing factor will be very similar to the normalizing factor in the NLMS algorithm. This allows a complexity reduction without significant impact to the performance.

While it is useful to analyze the reduction of cost of calculating the normalizing term, it is also interesting to examine what percentage of the computational cost of the entire adaptive filtering algorithm that reduction represents.

For calculating the complexity reduction of the entire adaptive filtering algorithm, the following assumptions are made:
1. Computing the filter output of an adaptive length-N FIR filter (i.e. adaptive filter 22 or linear predictors in LPC whitening filters) requires N MACs per sample.
2. Performing a length-N LMS filter coefficient update requires N MACs.
3. The length of the LPC analysis window (i.e. the length of the window used for calculating the filter coefficients of the linear predictor) is chosen to be equal to the LMS filter order N.
4. LPC analysis for a length-M LPC filter with a length-N analysis window requires $N \cdot (M+1)$ MACs.
5. LPC analysis update period (inverse of update rate) is chosen to be equal to ½ of the length of the LMS filter.
6. One division requires 24 MACs.
7. Two LPC whitening filters are used as shown in FIGS. 6 and 8. The cost X1 for using the NLMS algorithm updated every sample is:

$$X1 = A+B+C+D+E1+F1+G \quad \text{(Eq. 19)}$$

Here, X1 indicates the average number of MACs per sample required for the complete NLMS including pre-whitening. The term A (=N) corresponds to the number of MACs for the adaptive FIR filter (see filter 22 in FIG. 6). The term B (=N) indicates the number of MACs for the LMS coefficient update. The term C (=M) corresponds to the number of MACs for the first LPC whitening filter (see filter 25 in FIG. 6). The term D (=M) indicates the number of MACs for second LPC whitening filter (see filter 26 in FIG. 6). The term E1 (=2) refers to the number of MACs required to compute a normalizing term, i.e. the power sum (the power sum is computed once per sample). The term F1 (=24) corresponds to the number of MACs required to compute a normalizing scale factor based on the normalizing term (division), which is performed once per sample. The term G indicates the average number of MACs per sample required to perform LPC analysis, when assuming an update period of N/2. In view of assumption 4 above, the term G is equal to $(N \cdot (M+1))/(N/2) = 2 \cdot (M+1)$.

On the other hand, the cost X2 (i.e. the average number X2 of MACs per sample) for performing the preferred embodiment as shown in FIG. 8 is:

$$X2 = A+B+C+D+E2+F2+G \quad \text{(Eq. 20)}$$

In Eq. 20, the term A (=N) refers to the number of MACs for the adaptive FIR filter (see filter 22 in FIG. 8). The term B (=N) indicates the number of MACs for the LMS coefficient update. The term C (=M) corresponds to the number of MACs for the first LPC whitening filter (see filter 25' in FIG. 8). The term D (=M) denotes the number of MACs for the second LPC whitening filter (see filter 26 in FIG. 8). The term E2 refers to the average number of MACs per sample required to compute a normalizing term, when assuming an update period of N/2. The term E2 is equal to $2/(N/2) = 4/N$. The term F2 indicates the average number of MACs per sample required to compute the normalizing scale factor based on the normalizing term (division), assuming an update period of N/2. The term F2 is equal to $24/(N/2) = 48/N$. The term G corresponds to the average number of MACs per sample required to perform an LPC analysis, assuming an update period of N/2. In view of assumption 4 above, the term G is equal to $(N \cdot (M+1))/(N/2) = 2 \cdot (M+1)$.

The MIPS savings S (in percent) of the disclosed method with respect to NLMS can be estimated to:

$$S = 100 \cdot (1-(X2/X1)) \quad \text{(Eq. 21)}$$

The table hereafter presents the estimated complexity reduction S in line with Eq. 21 for the preferred embodiment over standard NLMS for a variety of adaptive filter lengths N and predictor orders M. For all entries, both an LPC analysis window length of N (see assumption 3 above) and an update period (inverse of update period) of K=N/2 (see assumption 5 above) are assumed.

|   | N | | | |
|---|---|---|---|---|
| M | 16 | 32 | 64 | 128 |
| 2 | 33.46% | 24.38% | 15.36% | 8.76% |
| 4 | 29.93% | 22.57% | 14.64% | 8.53% |
| 6 | 27.08% | 21.01% | 13.99% | 8.31% |
| 8 | 24.73% | 19.66% | 13.40% | 8.10% |
| 10 | 22.75% | 18.47% | 12.85% | 7.90% |

As can be seen in the table, the effective complexity reduction S is roughly inversely proportional to the adaptive filter order N and—to a smaller extent—to the predictor order M. This reduction is particularly important with respect to portable devices that rely upon battery power, in that it provides longer battery life between recharges and/or allow processor resources to be allocated to other tasks.

The methods, apparatuses and filter systems disclosed in the application may be useful in any product that contains an adaptive LMS filter which converges based on an unknown input signal. In particular, the methods, apparatuses and filter systems disclosed in the application may be used in an adaptive equalizer, in an adaptive echo canceller or in a feedback adaptive noise control system. In FIGS. 9-13 such applications are illustrated.

Figure 9:
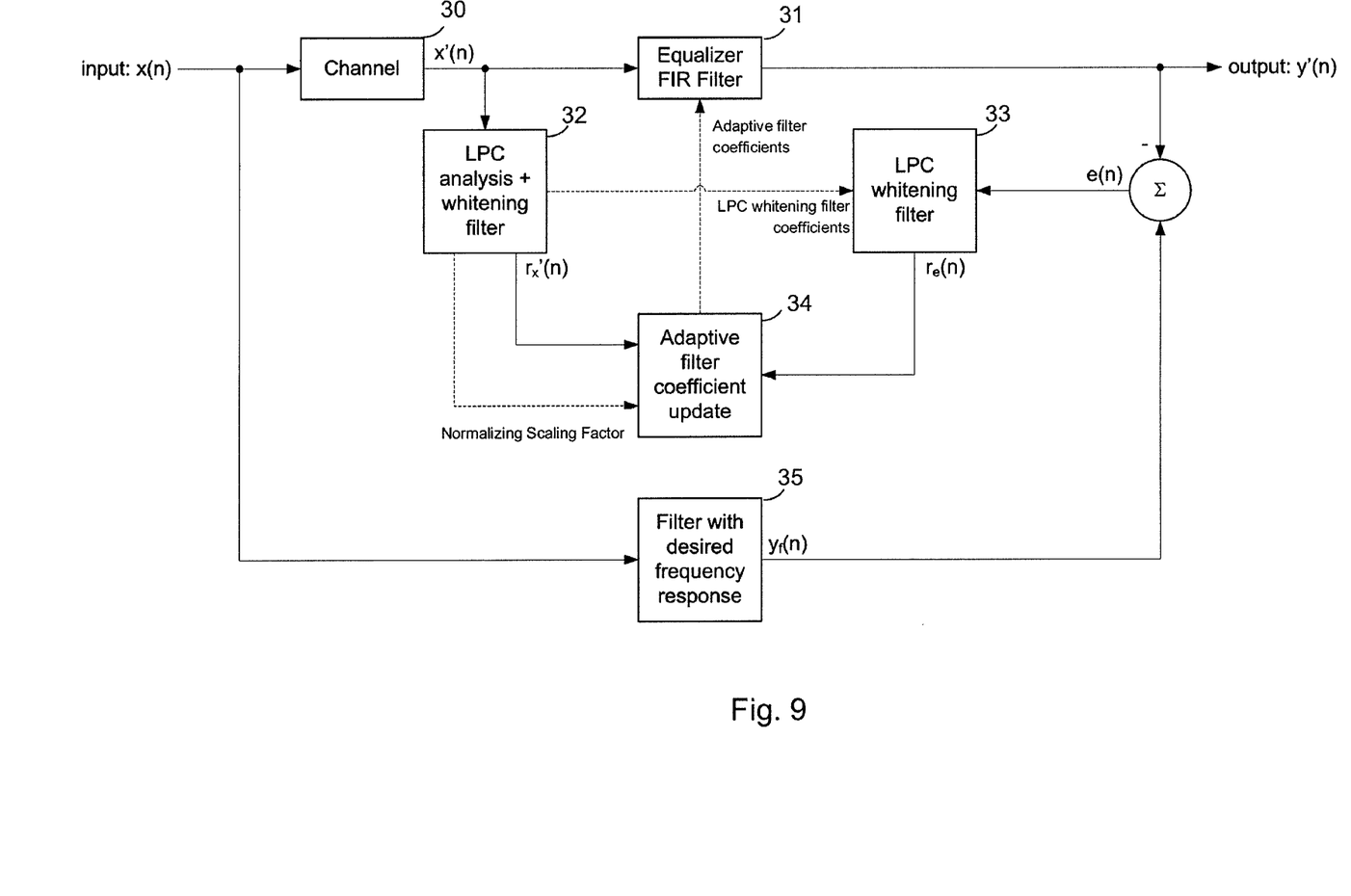
FIG. 9 illustrates an adaptive equalizer as a first application.

The first application in FIG. 9 is an adaptive equalizer, in which a signal passes through a channel 30 with an unknown frequency response which alters the input signal x(n) in an undesirable manner. A filter system comprising an adaptive filter 31, LPC pre-whitening filter blocks 32 and 33 and computation of a normalizing scaling factor in the filter block 32 based on the LPC analysis in the update path is used to make the overall frequency response of the signal path converge to the desired frequency response. The coefficients of adaptive filter 31 are updated in a filter coefficient update stage 34. This filter system is similar to the filter system in FIG. 8 (instead one could also use the structure of FIG. 7). In many cases, the desired overall frequency response is flat, and box 35 representing the filter with the desired frequency response is removed entirely (in this case box 35 is replaced by a through connection).

Figure 10:
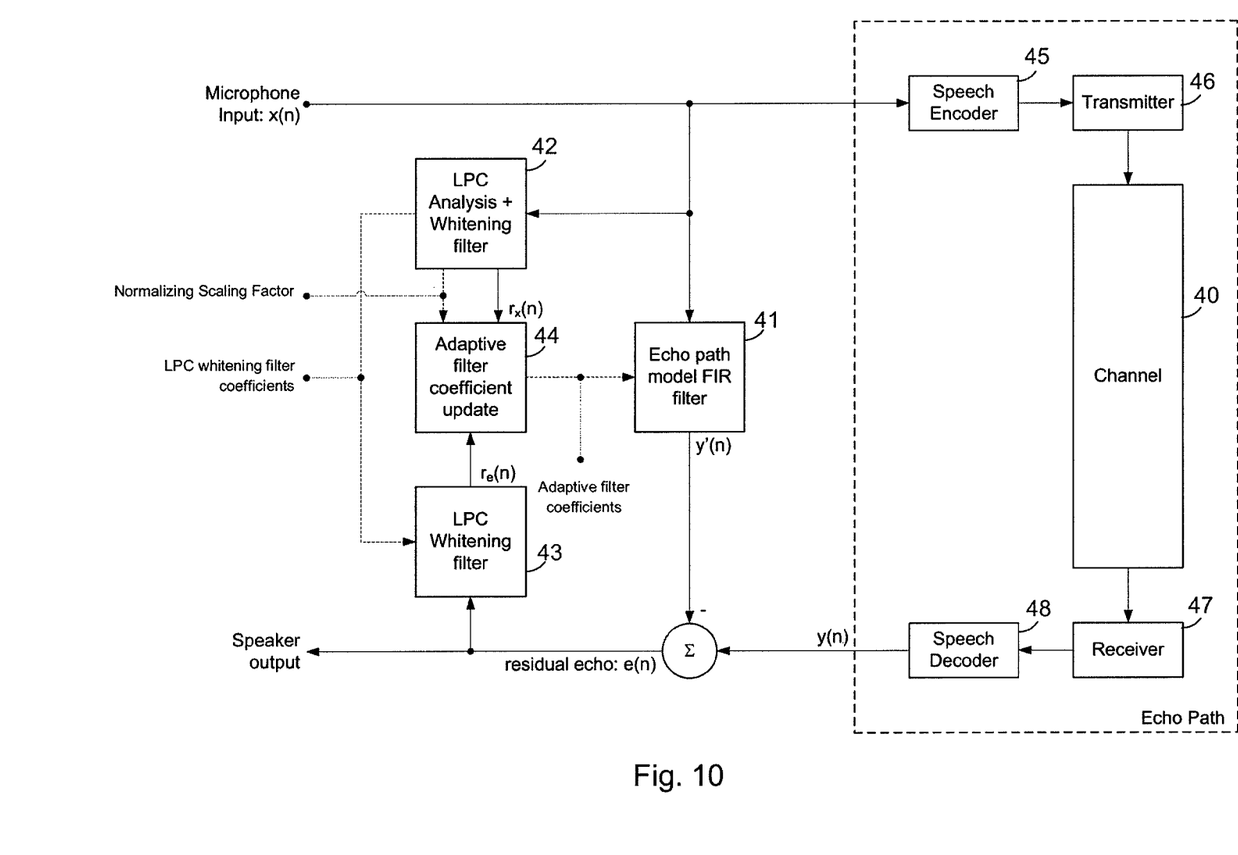
FIG. 10 illustrates an adaptive echo canceller as a second application.

The second application in FIG. 10 is an adaptive echo canceller, in which a signal picked up by a near-end microphone (see microphone input in FIG. 10) is transmitted via a speech encoder 45 and a transmitter 46 to a far-end speaker (not shown in FIG. 10, far-end speaker is part of channel 40), picked up by a far-end microphone (not shown in FIG. 10, far-end microphone is part of channel 40) and returned via a receiver 47 and a speech decoder 48 to a near-end speaker (see speaker output in FIG. 10) as an undesirable echo. In FIG. 10 an adaptive filter (see echo path model FIR filter 41) with pre-whitening (see whitening filters 42 and 43) and computation of a normalizing scaling factor based on the LPC analysis in the update path is used. The coefficients of FIR filter 41 are updated in a filter coefficient update stage 44. The structure is similar to the structure of the filter system in FIG. 8 (instead one could also use the configuration of FIG. 7). The adaptive filter models the far-end echo path and produces an estimate y'(n) of the echo signal returned to the near-end speaker. The echo estimate output y'(n) from the adaptive filter is subtracted from the signal y(n) returned to the near-end speaker in order to cancel the undesirable echo.

Figure 11:
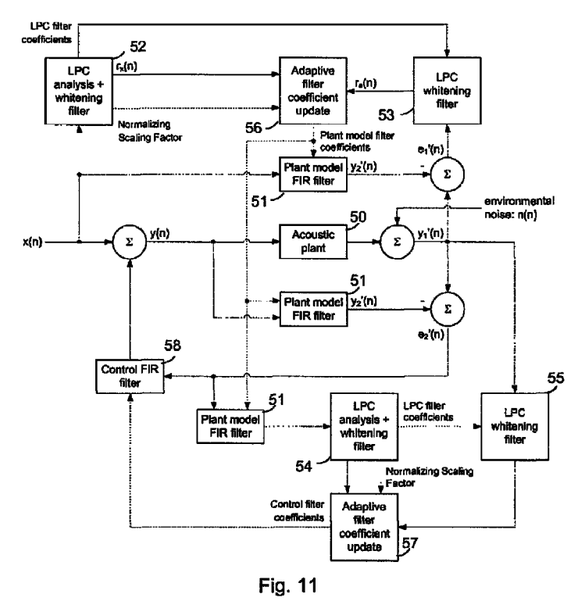
FIG. 11 illustrates a feedback adaptive noise control system as a third application.
Figure 12:
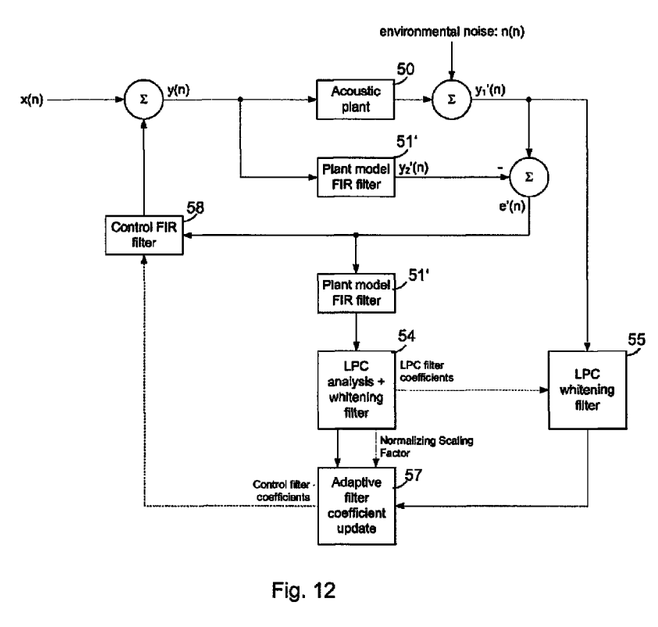
FIG. 12 shows a first simplified version of the third application in FIG. 11.
Figure 13:
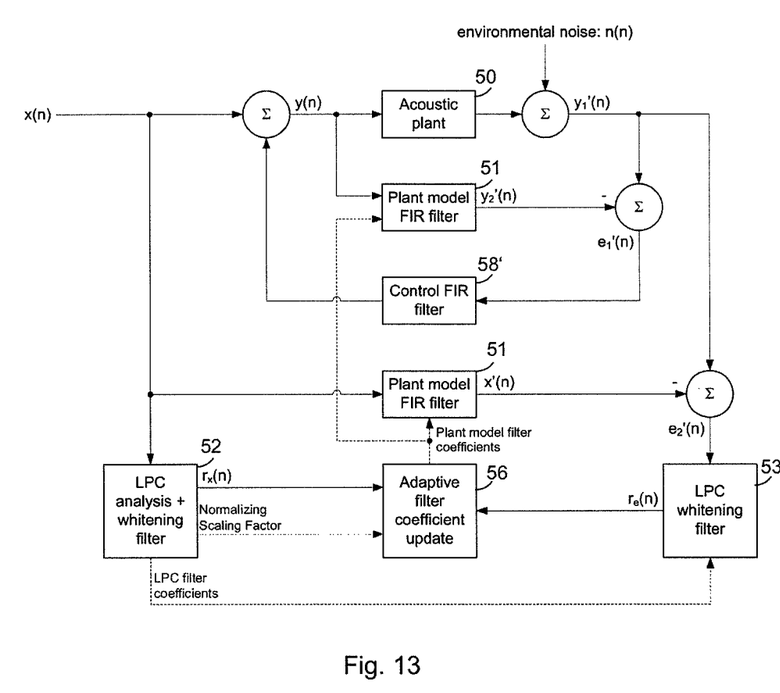
FIG. 13 shows a second simplified version of the third application in FIG. 11.

The third application in FIGS. 11-13 is a feedback adaptive noise control system, in which a signal y(n) output to a loudspeaker acoustically coupled to a human ear is distorted by the presence of an undesired environmental noise source n(n). The loudspeaker is part of an acoustic plant 50 corresponding to the acoustic channel. A signal $y_2(n)$ picked up by a microphone (the microphone is part of acoustic plant 50) located in close proximity to the speaker contains the sum of the signal output from the loudspeaker and the interfering noise n(n). A plant model filter 51 generates an estimate $y_2'(n)$ of the signal output from the loudspeaker, which is subtracted from the signal picked up by the microphone to generate an error signal $e_2'(n)$. The error signal $e_2'(n)$ is passed through a control filter 58 to generate a feedback anti-noise signal, which is added to a desired audio input signal x(n) to generate a modified input signal y(n). The anti-noise signal, when reproduced through the loudspeaker, will be equal in amplitude but opposite in phase compared to the undesired noise source n(n), resulting in a reduction in perceived noise level.

FIG. 11 is a version of the third application in which both the plant model filter and the control filter are filter systems comprising an adaptive filter (see plant model FIR filter 51 and control FIR filter 58) with pre-whitening (see LPC whitening filters 52 and 53 for plant model filter, and LPC whitening filters 54 and 55 for control filter) and computation of a normalizing scaling factor based on LPC analysis in the update path. The filter coefficients are updated in filter coefficient update stages 56 and 57. These filter systems are similar to the filter system in FIG. 8 (instead one could also use the structure of FIG. 7).

FIG. 12 is a second version of the third application. Figurative elements in FIGS. 11 and 12 denoted by the same reference signs are similar or the same. In FIG. 12 the control filter is a filter system comprising an adaptive filter (see control FIR filter 58) with pre-whitening (see LPC whitening filters 54 and 55) and computation of a normalizing scaling factor based on LPC analysis in the update path. The filter coefficients are updated in a filter coefficient update stage 57. The filter system is similar to the filter system in FIG. 8 (instead one could also use the structure of FIG. 7). The plant model filter 51' is not adapted in this version of the third application.

FIG. 13 is a third version of the third application. Figurative elements in FIGS. 11 and 13 denoted by the same reference signs are similar or the same. In FIG. 13 the plant model filter is a filter system comprising an adaptive filter (see FIR filter 51) with pre-whitening (see LPC whitening filters 52 and 53) and computation of a normalizing scaling factor based on LPC analysis in the update path. The filter coefficients are updated in a filter coefficient update stage 56. The filter system is similar to the filter system in FIG. 8 (instead one could also use the structure of FIG. 7). The control filter 58' is not adapted in this version of the third application.

The present patent application provides new methods for adaptive filtering with input signal pre-whitening. In particular, the application provides new methods for reducing complexity in an adaptive LMS filtering algorithm utilizing LPC pre-whitening filters. When computing the normalizing factor by 2 MAC operations and 1 division, the complexity reduction with respect to the NLMS algorithm is inversely proportional to the frequency at which the LPC pre-whitening filter coefficients are updated. In this case, for all LPC pre-whitening filter coefficient update rates, the computational complexity is less than or equal to the standard NLMS algorithm.

The invention claimed is:

1. A method for determining at least one updated filter coefficient of an adaptive filter adapted by a Least Mean Square (LMS) algorithm, the method comprising the steps of:
   determining filter coefficients of a first whitening filter outputting a filtered signal;
   determining a normalization value based on one or more computed values obtained in the step of determining the filter coefficients of the first whitening filter, the normalization value being based, at least in part, on an estimate of energy of the filtered signal; and
   transmitting the normalization value from the first whitening filter to an update stage of the adaptive filter configured for determining the at least one updated filter coefficient of the adaptive filter in dependency on the filtered signal and the normalization value.

2. The method of claim 1, wherein the first whitening filter is a Linear Prediction Coding (LPC) whitening filter outputting a residual signal as the filtered signal.

3. The method of claim 1, wherein the step of determining the normalization value further comprises:
   inverting the estimate of the energy.

4. The method of claim 1, wherein the at least one filter coefficient is determined based on the following LMS filter coefficient updating equation:

$$\hat{h}_i(n+1) = \hat{h}_i(n) + \frac{\mu \cdot r_x(n-i) \cdot r_e(n)}{\tilde{E}_r},$$

wherein $\hat{h}_i(n+1)$ denotes the updated at least one filter coefficient, with $i \in [0, 1, \ldots, N-1]$ and N indicating a number of filter coefficients of the adaptive filter, $\hat{h}_i(n)$ denotes an actual at least one filter coefficient, $r_x$ denotes the filtered signal, $r_e$ denotes an error signal and $\tilde{E}_r$ denotes the estimate of the energy.

5. The method of claim 1, wherein the first whitening filter is an LPC whitening filter outputting a residual signal as the filtered signal, and wherein the filter coefficients of the LPC whitening filter are determined based on an autocorrelation method in combination with Durbin's algorithm for solving autocorrelation equations.

6. The method of claim 5, wherein the estimate of the energy corresponds to a squared prediction error $E_j$ of an iteration j of Durbin's algorithm.

7. The method of claim 5, wherein the estimate of the energy corresponds to a squared prediction error $E_M$ of a last iteration of Durbin's algorithm.

8. The method of claim 7, wherein the squared prediction error $E_M$ is determined based on the squared prediction error $E_{M-1}$ of a penultimate iteration of Durbin's algorithm.

9. The method of claim 8, wherein the estimate of the energy is determined by two multiply-accumulate operations.

10. The method of claim 1, wherein the filter coefficients of the first whitening filter are adaptively updated.

11. The method of claim 10, wherein an updated normalization value is determined each time the filter coefficients of the first whitening filter are updated.

12. The method of claim 11, wherein the filter coefficients of the first whitening filter and the normalization value are updated at an update rate lower than a sampling rate of an input signal upstream of the adaptive filter and the first whitening filter.

13. The method of claim 12, wherein statistical characteristics of the input signal are essentially stationary during an update period of the normalization value.

14. The method of claim 1, wherein the step of determining the normalization value and the step of determining the filter coefficients of the first whitening filter are carried out once and thereafter the normalization value and the filter coefficients of the first whitening filter remain fixed.

15. The method of claim 1, wherein the adaptive filter receives the filtered signal.

16. The method of claim 1, wherein
the adaptive filter receives a signal from upstream of the first whitening filter, and
the at least one updated filter coefficient of the adaptive filter is determined further in dependency on an error signal filtered by a second whitening filter having the same filter coefficients as the first whitening filter.

17. The method of claim 1, wherein updated filter coefficients for all filter coefficients of the adaptive filter are determined.

18. The method of claim 1, wherein the estimate of the energy is determined during determining the filter coefficients of the first whitening filter.

19. An apparatus for determining at least one updated filter coefficient of an adaptive filter adapted by a Least Mean Square (LMS) algorithm, the apparatus comprising:
means for determining filter coefficients of a first whitening filter outputting a filtered signal and for determining a normalization value based on one or more computed values obtained by the means of determining the filter coefficients of the first whitening filter, the normalization value being based, at least in part, on an estimate of energy of the filtered signal;
an update stage of the adaptive configured for receiving the filtered signal and the normalization value and for determining at least one updated filter coefficient of the adaptive filter in dependency on the filtered signal and the normalization value; and
means for transmitting the normalization value to the update stage.

20. The apparatus of claim 19, wherein the means for determining filter coefficients are configured to determine filter coefficients of a Linear Prediction Coding (LPC) whitening filter outputting a residual signal as the filtered signal.

21. The apparatus of claim 19, wherein the means for determining the normalization value are configured to determine an energy estimate of the filtered signal based on the one or more computed values obtained by the means of determining the filter coefficients of the first whitening filter.

22. The apparatus of claim 21, wherein the means for determining filter coefficients are configured to determine filter coefficients of a Linear Prediction Coding (LPC) whitening filter outputting a residual signal as the filtered signal, and wherein the means for determining the filter coefficients of the LPC whitening filter are configured to determine the filter coefficients based on autocorrelation method in combination with with Durbin's algorithm for solving autocorrelation equations.

23. The apparatus of claim 22, wherein the estimate of the energy corresponds to a squared prediction error $E_M$ of a last iteration of Durbin's algorithm.

24. The apparatus of claim 19, wherein the means for determining the normalization value are configured to determine an updated normalization value each time when the filter coefficients of the first whitening filter are updated.

25. The apparatus of claim 24, wherein the filter coefficients of the first whitening filter and the normalization value are updated at an update rate lower than a sampling rate of an input signal upstream of the adaptive filter and the first whitening filter.

26. A filter system comprising:
an adaptive filter adapted by a Least Mean Square (LMS) algorithm;
a first whitening filter outputting a filtered signal;
means for determining filter coefficients of the first whitening filter and for determining a normalization value based on one or more computed values obtained by the means for determining the filter coefficients of the first whitening filter; wherein the means for determining filter coefficients of the first whitening filter includes the means for determining a normalization value; wherein the normalization value is based, at least in part, on an estimate of energy of the filtered signal; and
an update stage of the adaptive filter configured for receiving the filtered signal and the normalization value and for determining at least one updated filter coefficient of the adaptive filter in dependency on the filtered signal and the normalization value; wherein the means for determining filter coefficients of the first whitening filter transmits the normalization value to the update stage.

27. The filter system of claim 26, wherein the adaptive filter receives the filtered signal.

28. The filter system of claim 26, further comprising a second whitening filter, wherein the updating stage receives an error signal filtered by the second whitening filter.

29. The filter system of claim 26, wherein the adaptive filter is a Finite Impulse Response (FIR) filter.

30. A method for filtering a signal by an adaptive filter, the adaptive filter adapted by a Least Mean Square (LMS) algorithm, wherein at least one updated filter coefficient of the adaptive filter is determined according to the method of claim 1.

* * * * *